US012598726B2

(12) United States Patent
Wenk et al.

(10) Patent No.: US 12,598,726 B2
(45) Date of Patent: Apr. 7, 2026

(54) CONTROL MODULE FOR A VEHICLE WITH AT LEAST AN ELECTRIC MOTOR AND A TRANSMISSION

(71) Applicant: Vitesco Technologies Germany GmbH, Regensburg (DE)

(72) Inventors: Alexander Wenk, Burgoberbach (DE); Peter Schroll, Nuremberg (DE); Karl Maron, Heroldsberg (DE); Simon Kim, Nuremberg (DE); Cornel Mariutiu, Nuremberg (DE); Jürgen Sauerbier, Dachsbach (DE); Yvonne Wiegand, Mainstockheim (DE)

(73) Assignee: Vitesco Technologies Germany GmbH, Regensberg (DE)

( * ) Notice: Subject to any disclaimer, the term of this patent is extended or adjusted under 35 U.S.C. 154(b) by 239 days.

(21) Appl. No.: 18/446,726

(22) Filed: Aug. 9, 2023

(65) Prior Publication Data

US 2024/0017625 A1      Jan. 18, 2024

Related U.S. Application Data

(63) Continuation of application No. PCT/EP2022/053128, filed on Feb. 9, 2022.

(30) Foreign Application Priority Data

Feb. 10, 2021    (DE) ..................... 10 2021 201 248.5

(51) Int. Cl.
   *H05K 7/20*        (2006.01)
   *B60L 15/00*        (2006.01)
(52) U.S. Cl.
   CPC ............ *H05K 7/209* (2013.01); *B60L 15/007* (2013.01); *H05K 7/20927* (2013.01)

(58) Field of Classification Search
   None
   See application file for complete search history.

(56) References Cited

U.S. PATENT DOCUMENTS

| | | | |
|---|---|---|---|
| 8,587,977 B2 | 11/2013 | Nishikimi | |
| 2008/0174393 A1* | 7/2008 | Schnetzka | H02P 27/08 336/57 |

(Continued)

FOREIGN PATENT DOCUMENTS

| | | |
|---|---|---|
| DE | 112012000617 T5 | 11/2013 |
| DE | 102013222587 A1 | 5/2014 |

(Continued)

OTHER PUBLICATIONS

International Search Report and Written Opinion dated Jun. 7, 2022 from corresponding International Patent Application No. PCT/EP2022/053128.

(Continued)

*Primary Examiner* — Courtney L Smith

(57) ABSTRACT

A control module for a vehicle with at least one electric motor and a transmission is provided. The control module has a housing for receiving a transmission control electronics unit and an inverter electronics unit for controlling an electric motor, and a heat sink. The heat sink is disposed between a housing upper part and a housing lower part in such a manner that the heat sink forms part of the housing. The housing lower part and the heat sink form a medium-tight cavity for receiving the inverter electronics unit. The transmission control electronics unit is surrounded by a plastic casing. The transmission control electronics unit with the plastic casing forms the housing upper part. The housing upper part is connected to the heat sink in a thermally conductive manner such that a heat transport from the transmission control electronics unit to the heat sink takes place.

10 Claims, 3 Drawing Sheets

(56)                    References Cited

U.S. PATENT DOCUMENTS

| | | | | |
|---|---|---|---|---|
| 2009/0034309 A1* | 2/2009 | Ibori | ................. | H05K 7/20909 |
| | | | | 363/141 |
| 2010/0188813 A1 | 7/2010 | Nakatsu | | |
| 2011/0042038 A1* | 2/2011 | Herron | .............. | H05K 7/20927 |
| | | | | 165/104.11 |
| 2011/0194246 A1* | 8/2011 | Nakasaka | ......... | H05K 7/20927 |
| | | | | 361/688 |
| 2013/0301220 A1 | 11/2013 | Hotta | | |
| 2014/0132379 A1 | 5/2014 | Vafakhah | | |
| 2014/0132382 A1 | 5/2014 | Zarei | | |
| 2015/0062825 A1 | 3/2015 | Schaefer | | |
| 2017/0181333 A1* | 6/2017 | Kosaka | ................ | H02M 7/003 |
| 2022/0068541 A1 | 3/2022 | Vafakhah | | |
| 2022/0142014 A1* | 5/2022 | Ono | ........................ | H02B 1/48 |
| | | | | 361/699 |
| 2022/0174849 A1* | 6/2022 | Ono | ....................... | G01K 13/02 |

FOREIGN PATENT DOCUMENTS

| | | | |
|---|---|---|---|
| DE | 102013222595 A1 | 5/2014 |
| DE | 102013222599 A1 | 5/2014 |
| DE | 102014112330 A1 | 3/2015 |
| EP | 1713169 A1 | 10/2006 |

OTHER PUBLICATIONS

German Office Action dated Jan. 13, 2022 for corresponding German Patent Application No. 10 2021 201 248.5.

* cited by examiner

CONTROL MODULE FOR A VEHICLE WITH AT LEAST AN ELECTRIC MOTOR AND A TRANSMISSION

CROSS-REFERENCE TO RELATED APPLICATIONS

This application claims the benefit of PCT Application PCT/EP2022/053128, filed Feb. 9, 2022, which claims priority to German Application 10 2021 201 248.5, filed Feb. 10, 2021. The disclosures of the above applications are incorporated herein by reference.

TECHNICAL FIELD

The disclosure relates to a control module for a vehicle with at least one electric motor and a transmission.

BACKGROUND

Electric mobility means the utilization of electric cars. These are driven fully or partially electrically, have an onboard energy store, and receive their energy predominantly from the power grid.

Hybrid vehicles combine two drive technologies. Shorter distances can generally be covered electrically but the hybrid vehicles can also easily manage long distances using their internal combustion engine. Hybrid cars that are charged at an electric outlet are referred to as plug-in hybrids. Hybrid vehicles are considered a bridging technology until cars are driven completely by electricity.

The vehicles are generally provided with a transmission designed to transmit torque between an input and an output of the transmission by torque transmission clutches.

The operation of the transmission is controlled by a transmission control unit.

A further fundamental component of the electric drive train in hybrid and electric vehicles is the power electronics. They are responsible for activating the electric machine, communicating with the vehicle control system, and diagnosing the drive.

The power electronics generally includes an electronic control unit, an inverter, and a DC-to-DC converter. The control unit represents the control center of the power electronics. DC-to-AC converters or inverters convert the direct current of the battery into alternating current for the drive of the electric motor. The electric motor finally converts electrical energy into mechanical energy. This process is reversed in order to charge the battery.

The DC-to-DC converter, also referred to as converter or else inverter, is part of the further fundamental components of an electric-powered vehicle. It converts the high battery voltage of 100-400 volts or more into the much lower operating voltage, of 12 or 48 volts, for electronic components.

DE 10 2013 222 599 A1 describes a vehicle with an internal combustion engine and an electric motor, where a transmission control module also controls the electric motor, the inverter, and the DC-to-DC converter in addition to the transmission.

SUMMARY

The disclosure provides a compact control module for a vehicle with at least one electric motor and a transmission, as a result of which the number of the individual parts of the control module can be minimized and where it is possible for expensive, relatively low-loss construction elements to be dispensed with by virtue of the efficient dissipation of the heat generated by the electronics.

Implementations of the disclosure may include one or more of the following optional features. In some implementations, the control module includes a housing having a housing upper part and a housing lower part. A heat sink is disposed between the housing upper part and the housing lower part in such a manner that the heat sink forms a part of the housing.

The housing lower part and the heat sink form a media-tight cavity for receiving the inverter electronics unit, where the inverter electronics unit is connected to the heat sink in a thermally conductive manner.

The transmission control electronics unit is surrounded by a plastic casing to protect it from harmful environmental influences. The transmission control electronics unit with the plastic casing forms the housing upper part. The housing upper part is connected to the heat sink in a thermally conductive manner such that heat generated by electronic construction elements of the transmission control electronics unit is advantageously dissipated from the transmission control electronics unit directly to the heat sink.

A compact control module for an inverter and a transmission with a common efficient cooling device is consequently provided which can be used in a vehicle both as an attached-to and as a standalone control module.

In some implementations, the inverter electronics unit includes a circuit board with electronic construction elements as the circuit carrier. The circuit board of the inverter electronics unit is able to be populated with electronic construction elements on both sides, whereby the compactness of the assembly is even further increased.

In some examples, those electronic construction elements of the inverter electronic unit that are disposed on the side of the circuit board facing the housing upper part are connected directly to the heat sink in a thermally conductive manner. As a result, the electronic construction elements can be cooled even more effectively.

In some examples, the thermally conductive connection between the inverter electronics unit and the heat sink, or the thermally conductive connection between the electronic construction elements of the inverter electronics unit that are disposed on the side of the circuit board facing the housing upper part and the heat sink, is established by a thermally conducting material.

The thermally conducting material can be a thermally conductive paste or a thermally conductive adhesive.

Depending on the quantity of heat to be dissipated, and depending on the size of the contact area of the parts involved in the heat transmission, standard silicone-based heat-conductive pastes or high-performance heat-conductive pastes or heat-conductive adhesives with improved thermal conductivity can be used.

In some implementations, the cooling ducts of the heat sink, on the side that lies opposite the inverter electronics unit, are sealed in a media-tight manner with the housing upper part. As a result, the production costs of the heat sink can be significantly reduced.

In some examples, the housing upper part, including transmission control electronics unit and plastic casing, are connected to the heat sink to one another mechanically and in a thermally conducting manner by at least one connecting means or connector. The connecting means or connector engages in each case with a corresponding receptacle of the heat sink, wherein at least one of the connecting means may be a screw or a rivet. This modular design is simple, safe and provides efficient heat transport away from the electronics unit.

In some implementations, the plastic casing of the housing upper part is made of a thermosetting or thermoplastic material. As a result, the electronic construction elements of the transmission control electronics unit are reliably protected against external environmental influences. Moreover, a separate cover for covering the transmission control electronics unit is saved.

For increasing the thermal conductivity, the plastic casing can additionally be provided with at least one inorganic filler.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
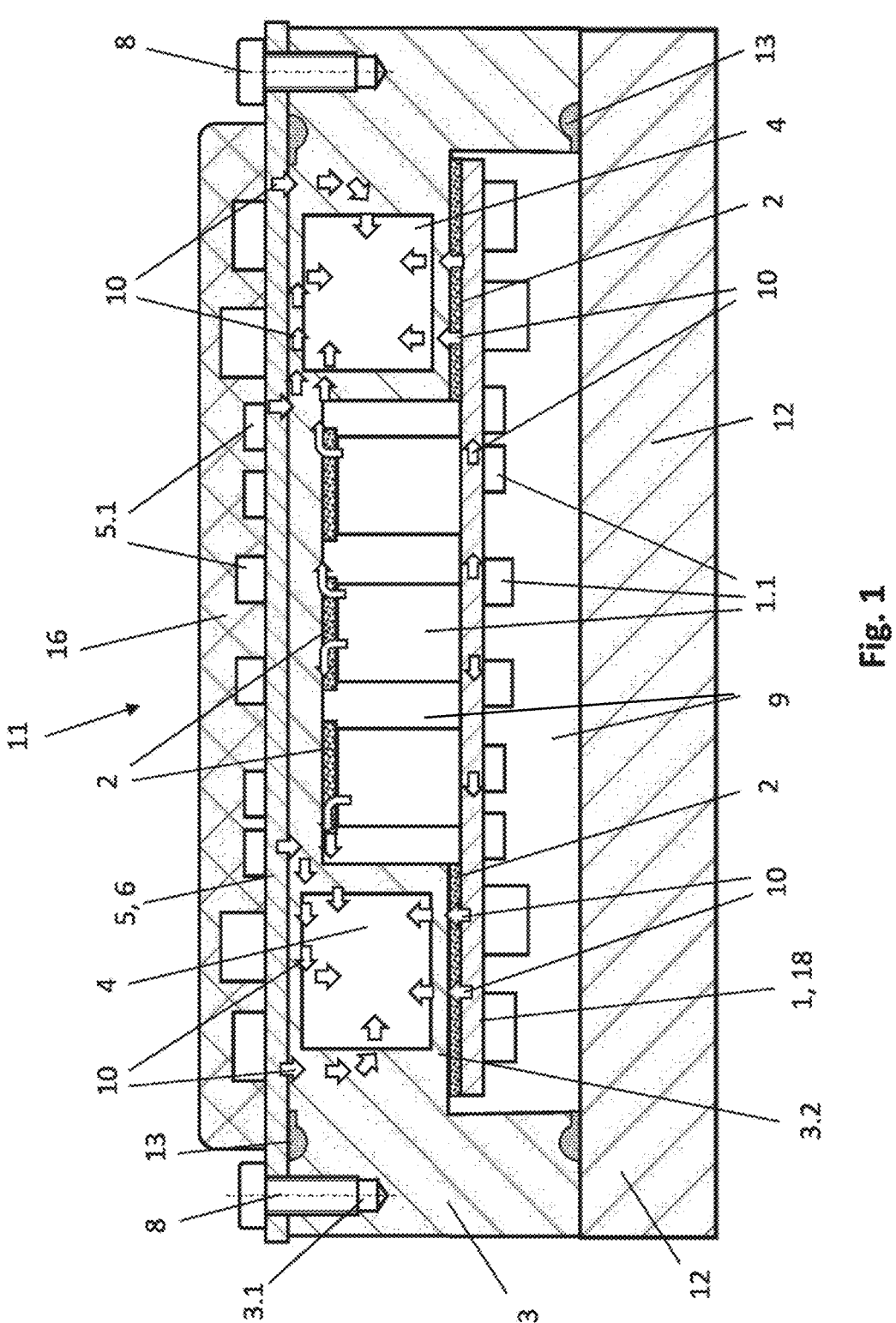
FIG. 1 shows a schematic sectional view of a control module.

FIG. 1 shows a control module for a vehicle which has at least one electric motor and a transmission, for example, an electric car or a hybrid vehicle. The control module has a housing 11, 12 for receiving a transmission controller 5 for controlling the transmission, and an inverter electronics unit 1 for controlling an electric motor. In addition, the control module has a heat sink 3 in order to dissipate the heat generated by the electronics unit of the control module via a coolant.

The housing 11, 12 includes a housing upper part 11 and a housing lower part 12.

The heat sink 3 is disposed between the housing upper part 11 and the housing lower part 12, and thus also between the transmission control electronics unit 5 and the inverter electronics unit 1, such that the heat sink 3 forms part of the housing 3, 11, 12.

The housing lower part 12 and the heat sink 3 form a media-tight cavity 9 for receiving the inverter electronics unit 1. The housing lower part 12 and the heat sink 3 are connected to one another mechanically, for example in a materially-bonded manner by adhesive bonding or welding. To increase the tightness, a seal 13 is disposed between the housing lower part 12 and the heat sink 3. The seal 13 can be may be, for example, a separate insert seal or an adhesive seal.

The inverter electronics unit 1 includes a circuit board 18 and electronic construction elements 1.1 disposed thereon. The electronic construction elements 1.1 are attached here both to the lower side of the circuit board 18 of the inverter electronics unit 1, which faces the housing upper part 11, and to the upper side of said circuit board 18. The electronic construction elements 1.1 are disposed here on the lower side in the central region of the circuit board 18, for example, in the vicinity of a coolant duct 4 of the heat sink 3. As a result of the circuit board 18 of the inverter electronics unit 1 being populated on both sides, the heat sink 3 on the periphery has a step 3.2 which runs in each case in the direction of a connecting means 8 and on which that part of the lower side of the inverter electronics unit 1 which is free of construction elements rests. A heat-conducting material 2 between the step 3.2 of the heat sink 3 and the inverter electronics unit 1 ensures good heat transport 10 from the inverter electronics unit 1 to the heat sink 3. With the use of a heat-conductive adhesive 2, an extra mechanical connection between the inverter electronics unit 1 and the heat sink 3 can be dispensed with.

In FIG. 1, the height of the step 3.2 is adapted to the height of the electronic construction elements 1.1 disposed on the lower side of the inverter electronics unit 1 such that here the construction elements 1.1 are connected directly in a thermally conductive manner to the heat sink 3 by the thermally conducting material 2.

In the case of these electronic construction elements 1.1 disposed on the lower side of the inverter electronics unit 1, the heat transport 10 to the heat sink 3 thus takes place both via the circuit board 18 of the inverter electronics unit 1 as well as directly from the construction elements 1.1. For example, electronic construction elements 1.1 that generate a particularly large amount of heat can therefore populate the circuit board 18 here. In addition, to further increase the heat transport 10 to the heat sink 3, instead of a standard heat-conducting material 2 an albeit more expensive but better high-performance thermally conducting material can be used.

The housing upper part 11, includes transmission control electronics unit 5 with plastic casing 16, is connected mechanically, for example, in a force-fitting manner, and in a thermally conducting manner to the heat sink 3 by connecting means 8 or connector. The connecting means 8 or connector engages in each case with a corresponding receptacle 3.1 of the heat sink 3. In FIG. 1, a screw 8 is screwed into a corresponding thread 3.1 in the heat sink 3 here. A rivet could also be used instead of a screw, for example.

A circumferential seal 13 is disposed between the housing upper part 11 and the heat sink 3 in FIG. 1 here in order to increase the sealing effect. This seal 13 can be, for example, as an insert seal or an adhesive seal.

The transmission control electronics unit 5 has a circuit board 6 with electronic construction elements 5.1 disposed thereon. The connecting element 8 is guided through a corresponding bore in the circuit board 6 of the transmission control electronics unit 5. In FIG. 1, the plastic casing 16 of the transmission control electronics unit 5, which is made from a thermosetting or a thermoplastic material, substantially encases that region of the circuit board 6 in which the electronic construction elements are disposed. However, the plastic casing 16 of the transmission control electronics unit 5 could also extend up to the periphery of the circuit board 6, in which case the connecting means 8 would then be guided through a corresponding bore in the plastic casing 16 and the circuit board 6.

The electronic construction elements 5.1 are disposed here in FIG. 1 on that side of the circuit board of the transmission control electronics unit 5 which faces away from the inverter electronics unit 1.

The housing lower part 12 is fastened mechanically, for example in a materially-bonded manner, to that side of the heat sink 3 that lies opposite the housing upper part 11, and forms the interface of the control module, here as an attached-to example, to a transmission, not shown. The control module, however, could also be installed in the vehicle as a standalone design, separated from the transmission.

Figure 2:
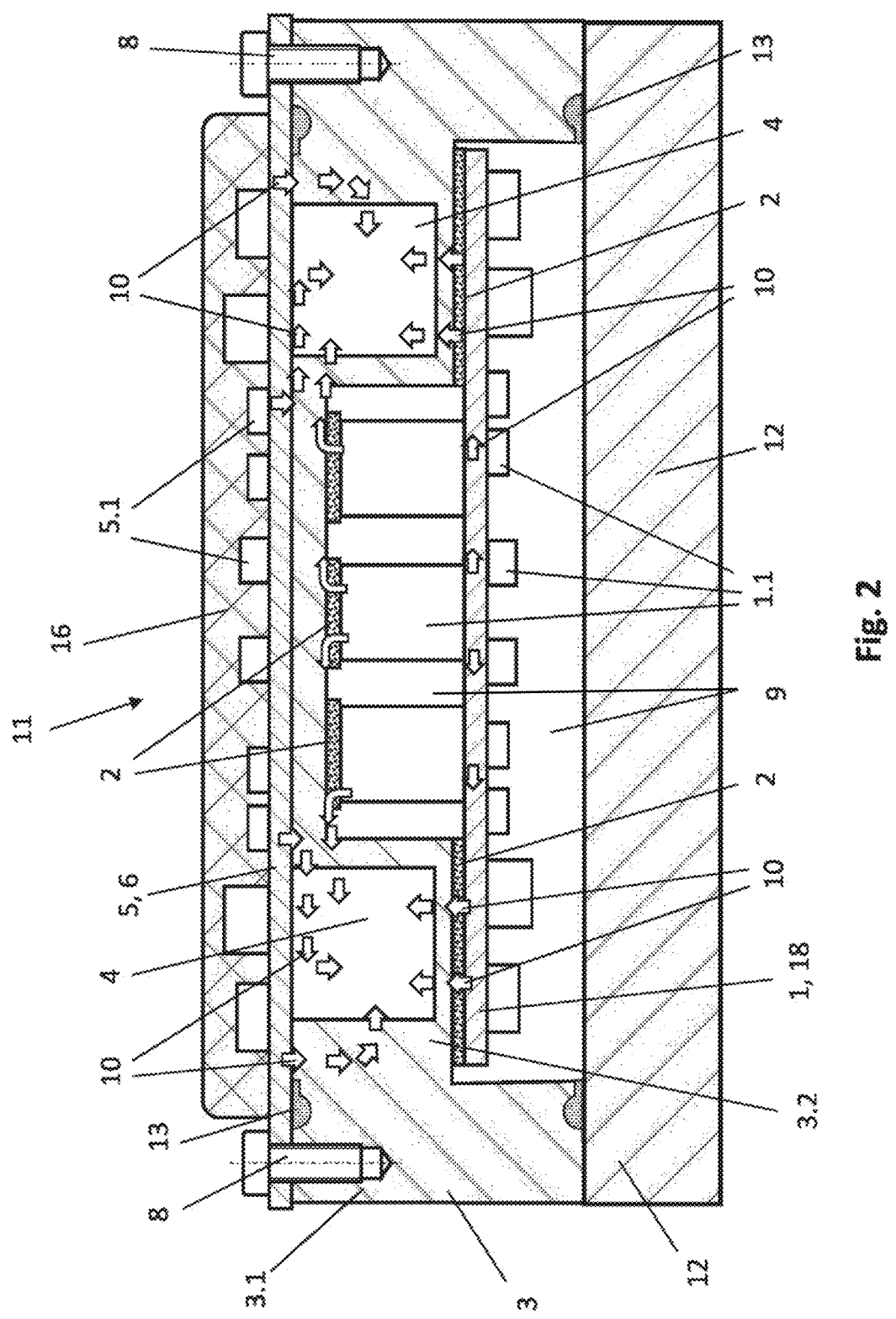
FIG. 2 shows a further sectional view of a control module.

In FIG. 2, in contrast to FIG. 1, in which the heat sink 3 is inherently closed, that is to say made from one piece, the cooling ducts 4 of the heat sink 3, on the side that lies opposite the inverter electronics unit 1, are sealed with the housing upper part 11. As a result, the manufacturing costs of the heat sink 3 can be significantly reduced.

Figure 3:
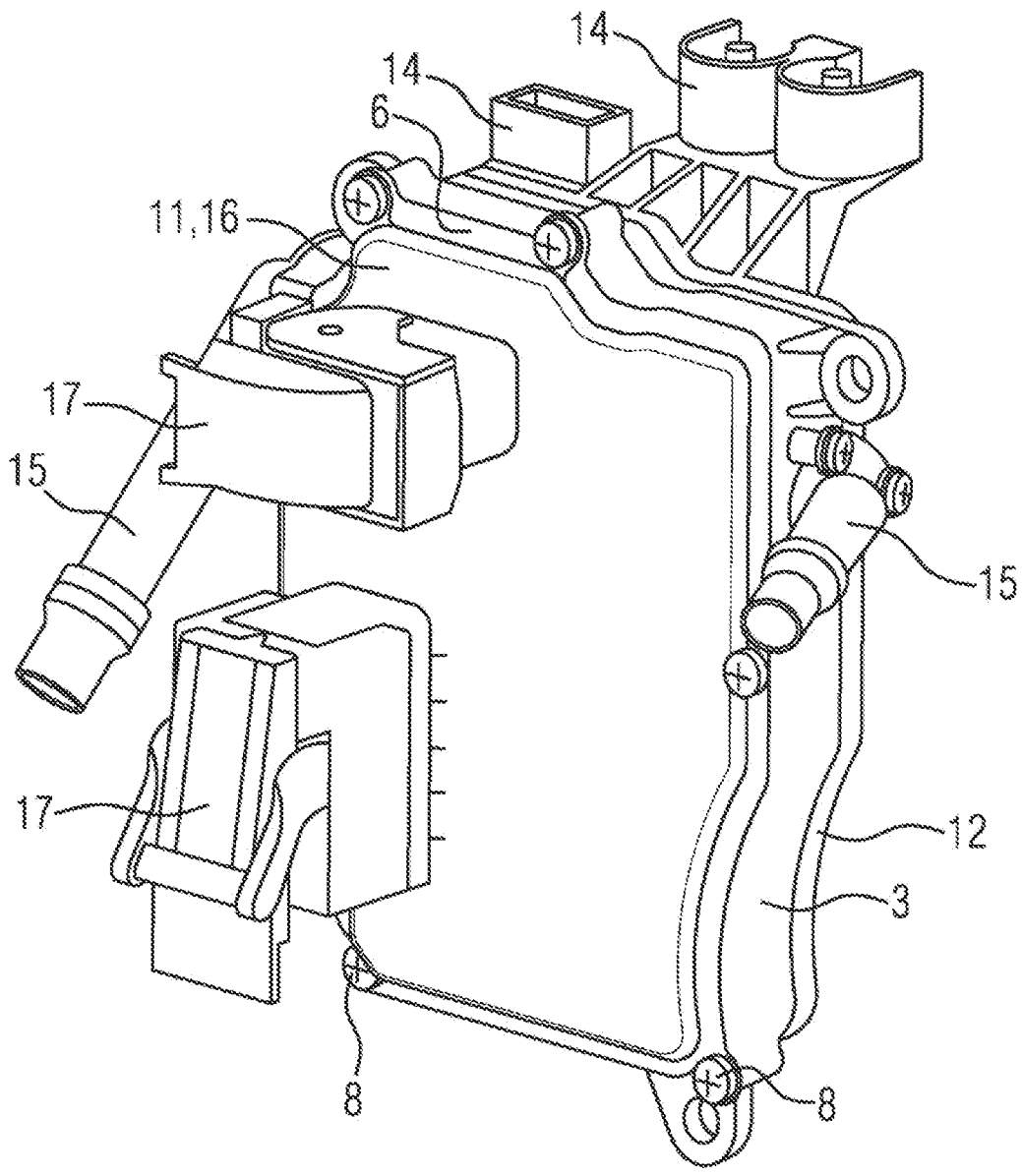
FIG. 3 shows a view of a further control module.

FIG. 3 shows an external view of a control module housing with a housing upper part 11 with a plastic casing 16 and a circuit board 6, a heat sink 3, and a housing lower part 12. The heat sink 3 is disposed between the housing upper part 11 and the housing lower part 12.

The housing upper part 11, including transmission control electronics unit 5 with plastic casing 16 and circuit board 6, and the heat sink 3 are connected to one another by the connecting means 8 or connector. The connecting means 8 or connector is in each case guided through a bore in the circuit board 6.

The heat transport 10 thus takes place from the circuit board 6 of the transmission control electronics unit 5 directly to the heat sink 3.

The electrical connectors 17 of the transmission control electronics unit 5, for exchanging signals and supply voltages with a surrounding electronics unit (not shown), are located here on the upper side of the housing upper part 11, but could also be placed on the side of the housing upper part 11, for example.

The electrical connector 14 for the inverter electronics unit 1 is disposed on the housing lower part 12 here.

The heat sink 3, here on its longitudinal sides, has in each case a cooling connector 15.

This compact control unit for an inverter and a transmission with a common efficient cooling device can be used in a vehicle both as an attached-to and as a standalone control unit.

A number of implementations have been described. Nevertheless, it will be understood that various modifications may be made without departing from the spirit and scope of the disclosure. Accordingly, other implementations are within the scope of the following claims.

LIST OF REFERENCE SIGNS

1 Inverter electronics unit
1.1 Electronic construction element of the inverter electronics unit
2 Thermally conducting material
3 Heat sink
3.1 Receptacle for connecting means
3.2 Step of the heat sink
4 Coolant duct
5 Transmission control electronics unit
5.1 Electronic construction element of the transmission control electronics unit
6 Circuit board of the transmission control electronics unit
8 Connecting means
9 Cavity
10 Heat transport
11 Housing upper part
12 Housing lower part
13 Seal
14 Inverter electronics unit connector
15 Cooling connector
16 Plastic casing

17 Transmission control electronics unit connector
18 Circuit board of the inverter electronics unit

What is claimed is:

1. A control module for a vehicle with at least one electric motor and a transmission, the control module comprising:
   a housing for receiving a transmission control electronics unit, the housing including a housing upper part and a housing lower part;
   an inverter electronics unit for controlling an electric motor, the inverter electronics unit includes an upper side and a lower side, electronic construction elements are positioned on both the upper side and the lower side of the inverter electronics unit;
   a heat sink disposed between the housing upper part and the housing lower part, wherein the heat sink forms part of the housing;
   a media-tight cavity defined by the housing lower part and the heat sink, the inverter electronics unit is connected to the heat sink in a thermally conductive manner within the media-tight cavity; and
   a plastic casing surrounding the transmission control electronics unit, the transmission control electronics unit and the plastic casing together form the housing upper part;
   wherein the housing upper part is connected to the heat sink in a thermally conductive manner such that heat is transferred from the transmission control electronics unit to the heat sink.

2. The control module of claim 1, wherein the inverter electronics unit comprises a circuit board supporting the electronic construction elements.

3. The control module of claim 2, wherein the upper side of the inverter electronics unit faces the housing upper part, the electronic construction elements disposed on the upper side of the inverter electronics unit are connected directly to the heat sink in a thermally conductive manner.

4. The control module of claim 2, wherein at least the thermally conductive connection between the inverter electronics unit and the heat sink, or the thermally conductive connection between the electronic construction elements of the inverter electronics unit that are disposed on a side of the circuit board facing the housing upper part and the heat sink, is established by a thermal conducting material.

5. The control module of claim 2, wherein the thermally conducting material is a thermally conductive paste or a thermally conductive adhesive.

6. The control module of claim 1, wherein the heat sink comprises cooling ducts, the cooling ducts are sealed in a media-tight manner with the housing upper part.

7. The control module of claim 1, wherein the housing upper part and the heat sink are connected to one another mechanically and in a thermally conducting manner by at least one connector, wherein the connector engages with a corresponding receptacle of the heat sink.

8. The control module of claim 7, wherein the at least one connector is a screw or a rivet.

9. The control module of claim 1, wherein the plastic casing of the housing upper part comprises a thermosetting or a thermoplastic material.

10. The control module of claim 1, wherein the plastic casing comprises at least one inorganic filler for increasing the thermal conductivity.

* * * * *